US006818906B1

(12) United States Patent
Hartley et al.

(10) Patent No.: US 6,818,906 B1
(45) Date of Patent: Nov. 16, 2004

(54) ELECTRON BEAM POSITION REFERENCE SYSTEM

(75) Inventors: John G. Hartley, Fishkill, NY (US); Rodney A. Kendall, Ridgefield, CT (US); David J. Pinckney, Newtown, CT (US); Richard A. Rieland, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,079

(22) Filed: Jun. 25, 2003

(51) Int. Cl.[7] ............................ G02B 5/00; H01J 37/304
(52) U.S. Cl. .................. 250/491.1; 250/398; 250/252.1
(58) Field of Search ........................... 250/505.1, 491.1, 250/492, 398, 252.1

(56) References Cited

U.S. PATENT DOCUMENTS

2002/0154839 A1 * 10/2002 Trost ........................... 384/100
2003/0211402 A1 * 11/2003 Hill ................................ 430/5

* cited by examiner

Primary Examiner—Nikita Wells
Assistant Examiner—Erin-Michael Gill
(74) Attorney, Agent, or Firm—Jay H. Anderson

(57) ABSTRACT

A system for supporting and adjusting the position of an object in a vacuum includes inner and outer support rings that are connected by flexible mounts that are compliant along one axis and stiff along other axes, and drivers extending through the wall of the vacuum chamber that move the supports independently along their respective axes. At least the inner support is clamped after adjustment by a clamp that exerts a strong clamping pressure while exerting transverse force only less than a threshold selected to avoid motion after adjustment.

6 Claims, 4 Drawing Sheets

ELECTRON BEAM POSITION REFERENCE SYSTEM

BACKGROUND OF INVENTION

The field of the invention is that of vacuum technology, and in particular that of electron beam technology.

Electron beam (e-beam) lithography tools are commonly used in semiconductor manufacturing to form sub-micron shapes on a semiconductor wafer. Shapes are formed by directing a beam of electrons from a source at one end of a column onto a photoresistive layer on a substrate at an opposite end of the column. A typical substrate may be 200 mm–300 mm in diameter or larger. These submicron shapes may be formed either by writing the shape directly onto a photoresistive layer on the substrate, wherein the substrate is a semiconductor wafer; or, by writing the shape onto a photoresistive layer on a substrate which is used as a mask, subsequently, to print the shape onto the semiconductor wafer.

Further, there are two broad types of writing modes used in electron beam lithography. The first type is referred to as "blind mode" or a "dead reckoning mode" and is commonly used in mask making. In the blind mode, the substrate is a featureless blank coated with resist and all of the patterns are placed by dead reckoning. The second mode, which may be referred to as the "registered write mode" or a "direct write mode," is commonly used in direct write applications, i.e. writing directly onto a semiconductor wafer, in what are referred to as device fabrication runs. In the registered write mode case, the patterns must be precisely located relative to previous levels which requires registration targets built into each level and the substrate as well. Regardless of the mode employed, accurately placing or repeating sub-micron shapes at precise locations across a distance of 200–300 mm demands precise beam registration.

However, even if the beam is registered adequately when pattern printing begins, during the course of writing the pattern, the e-beam may exhibit what is referred to as drift, i.e., exhibiting increasing inaccuracy in one direction as time passes. So, in order to maintain adequate precision, pattern writing may be interrupted periodically, depending on the particular tool's inherent e-beam drift, to check tool registration and, whenever registration error exceeds an acceptable tolerance, to adjust the beam.

Normally, the substrate is held on a stage opposite (beneath) the beam source and this registration measurement involves diverting the stage to position a registration target under the beam. Then, the beam is scanned over the registration target, the target's location is measured and the target's measured location is compared against an expected result. Any measured errors are corrected by adjusting the beam or adjusting stage positional controls. Then, the stage is returned to its former position to resume writing the mask pattern. This measurement and reregistration can be time consuming.

Furthermore, for this e-beam registration approach, the registration measurement takes place at a stage location other than where the pattern is actually written. Consequently, even after measuring and correcting errors, moving the stage back into position from the measurement area may actually introduce errors, such as from the stage slipping or from other move related stresses. Also, to assure complete accuracy, the beam should be reregistered, frequently, preferably at each field. However, when throughput is a consideration, as it nearly always is, it is impractical to correct the beam registration prior to printing each field.

U.S. Pat. No. 6,437,347, entitled "Target Locking System for Electron Beam Lithography" to Hartley et al., teaches an e-beam exposure system that may use the invention in its calibration subsystem. This system uses a field locking target that includes alignment marks.

The '347 patent shows an e-beam lithographic system capable of in situ registration. The preferred system is a Variable Axis Immersion Lens (VAIL) e-beam system and is a double hierarchy deflection system. A controllable stage moves a substrate with respect to the beam axis placing the intended substrate writing field within an aperture on a field locking target. The field locking target is located between the optics section and the substrate and the aperture is sized to permit the beam to write the field. The field locking target includes alignment marks around the aperture. A differential interferometric system measures the relative positions of the field locking target and the stage. As the stage is moving into position for writing a field, the beam is swept to hit the alignment marks, checking system alignment. The beam control data (coil currents and electrostatic deflection plate voltages) required to hit the marks are stored, and drift correction values calculated and the field beam control data adjusted accordingly.

FIG. 5 shows a cross-sectional diagram of a typical e-beam lithography system 500. This system includes an optics section 502 with a registration focus coil 504a, an autofocus coil 504b, beam deflection coils 506, 508, a projection lens axis shifting yoke 510 and beam deflection plates 511.

An e-beam source 90 emits a beam represented by arrow 512, which, during writing, travels to a target field on a substrate held on carrier 514. Autofocus coil 504b adjusts beam focus for target height variations resulting from substrate imperfections, thickness variations, etc. In the preferred VAIL lens system, double deflection yokes 506, 508 magnetically deflect the beam 512; and axis shifting coil 510 shifts the variable axis of the projection lens to follow the deflected beam 512. The relatively slow magnetic deflection from coils 506, 508 determines the subfield location, while within the subfield, the beam 512 is deflected by the high speed electrostatic deflection plates 511.

A passive field locking target 516 permits the beam 512 to write the pattern in the substrate's target field through an aperture 518. The preferred aperture is rectangular and is large enough to permit writing an entire field. During normal pattern writing, substrate subfields are placed within the field locking target aperture 518 and electrostatic deflection is used to write spots which form the pattern shapes. During registration, the subfield is defined as being over marks on the field locking target 516 adjacent to the aperture 518; and, the beam is deflected accordingly, as represented by arrows 512'. Then, the marks on the field locking target 516 are scanned, in situ, with the electrostatic deflection, to provide near real time positional feedback information.

For tracking and selecting stage location, the e-beam system 500 includes a differential interferometric system 520. The interferometric system 520 directs a laser, represented by arrows 522, to laser targets 524 and 524' to measure the relative position of the field locking target 516 to the stage mirror assembly 526. Laser target 524 is mechanically coupled to field locking target 516 and laser target 524' is attached to a stage mirror assembly 526. The carrier 514 is kinematically clamped to the stage mirror assembly 526 at points 528. The stage mirror assembly 526, in turn, is flexure mounted to a stage base 530 at points 532. An x or y drive 534 is attached to an appropriate side of the stage base 530 to drive the stage, typically under computer control, in the x or y direction; and, once in place, to lock the stage in place. A mechanical centering adjustment 536 provides a fine adjustment for the field locking target 516 to precisely place it with respect to the beam.

There is a need for a system in which the position of the electron beam in space is more directly related to the workpiece. In particular, the position of the workpiece being illuminated with a pattern by the beam must be repeatably located in space in order to align the various components of the pattern being written.

SUMMARY OF INVENTION

The present invention addresses the above-described need by providing an apparatus for relating the actual beam position with the actual mechanical position of a mechanical reference in an electron beam system.

A feature of the invention is the provision of a mounting plate that supports an e-beam target and a fixed laser target that is adjustable to normalize the reference laser beams.

Another feature is the ability for XY translation of the field locking target in a vacuum environment actuated from atmosphere.

Another feature of the invention is a clamping system for the application of clamping force in a vacuum environment where fine adjustment of the clamping force is not possible.

Yet another feature of the invention is a force application system in which a sizable clamping force is applied through a member that does not permit the application of a transverse force.

DETAILED DESCRIPTION

In an electron beam system including an embodiment of the invention, the electron beam is tuned and aligned relative to the optical components of the system. Once the beam has been tuned, it will be close to, but not exactly on, its nominal position. It is then necessary to establish where the (undeflected) beam actually is in space. The stage carrying the workpiece (e.g. a mask) being written on is then relative to the beam's actual position.

Figure 1:
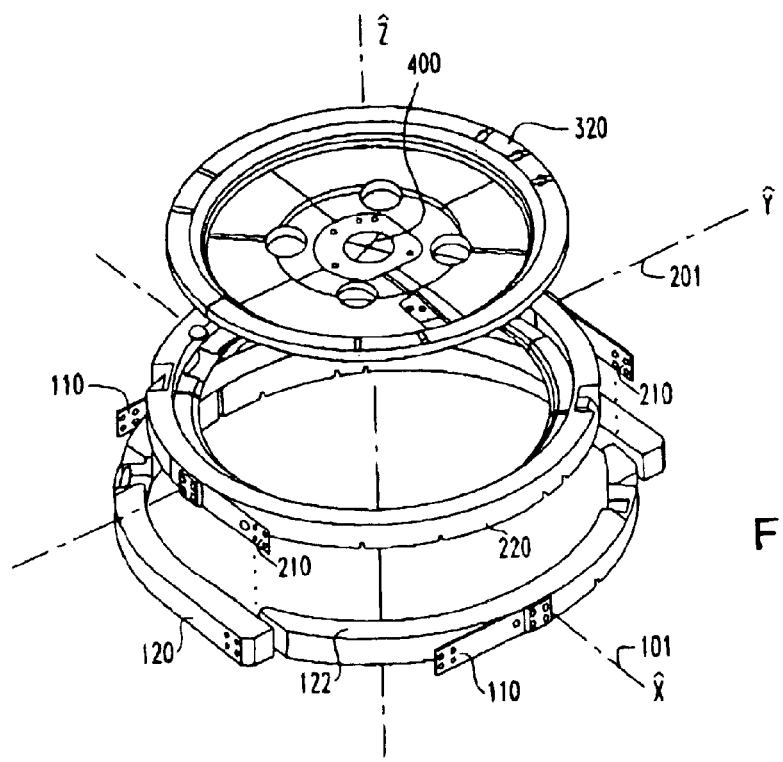
FIG. 1 shows an exploded view of an embodiment of the invention.
Figure 5:
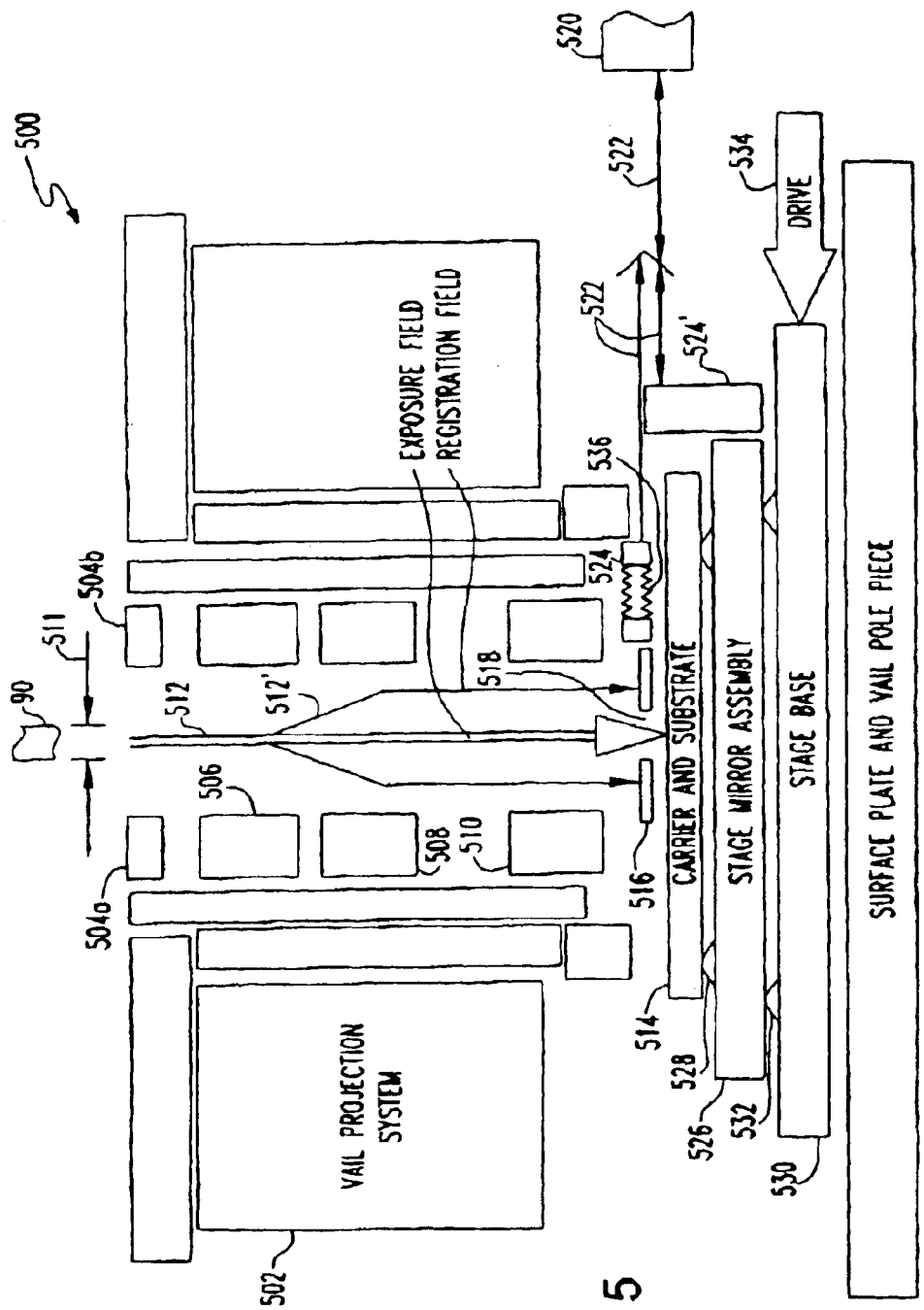
FIG. 5 illustrates an overall view of a prior art system in which the invention may be advantageously used.

FIG. 1 shows an exploded view of a portion of an apparatus embodying the invention; this apparatus performs the functions of the electron beam reference and laser position reference in the e-beam system (e.g. the system shown in FIG. 5). At the bottom of FIG. 1, an outer support member (ring 120) moves along X-axis 101 and supports the other components. Ring 120 is flexibly mounted to a base support (and reference frame) not shown in this Figure by flexures 110, illustratively a strap of beryllium-copper, that provide a compliant response for motion along axis 101 and are very stiff for motion in other directions, thus effectively permitting motion only along axis 101.

Within ring 120, a second inner support member (ring 220) is flexibly mounted to ring 120 by a pair of the same flexures, 210. Flexures 210 are oriented along Y-axis 201 and permit compliant movement along the axis and are stiff for other motion. Rings 120 and 220 are controlled by actuators shown below in connection with FIG. 4.

At the top of FIG. 1, reference plate 320 supports a number of components that provide the references needed. At the center of plate 320, beam-detecting member 400 provides support for a beam grid that intercepts the beam, an electron detector that detects electrons scattered by the beam grid and a pair of laser mirrors that are rigidly mounted to relate the beam position to the position in space as detected by the same laser interferometer that controls the motion of the workpiece.

Figure 2:
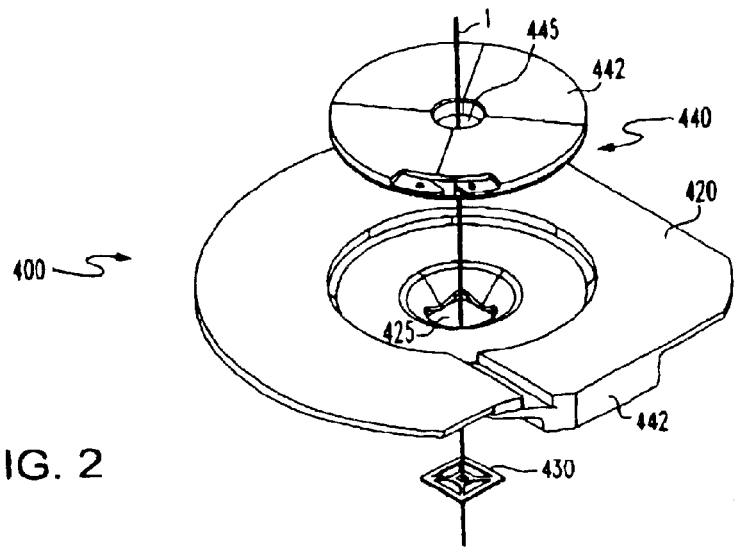
FIG. 2 illustrates a detail of a beam-detecting subsystem.

Referring to FIG. 2, there is shown a detail of FIG. 1. The apparatus 420 in the central portion of FIG. 1 provides the essential link between the beam position and the mechanical position. The beam, passing through aperture 445 in detector 440, is scanned over the beam grid 430 (positioned in aperture 425), generating electrons scattered in the backward direction (as a function of beam deflection current or voltage). Backscatter diode 440, illustratively divided into four quadrants 442, generates signals representing the connection between beam deflection and beam position relative to the grid.

Figure 3:
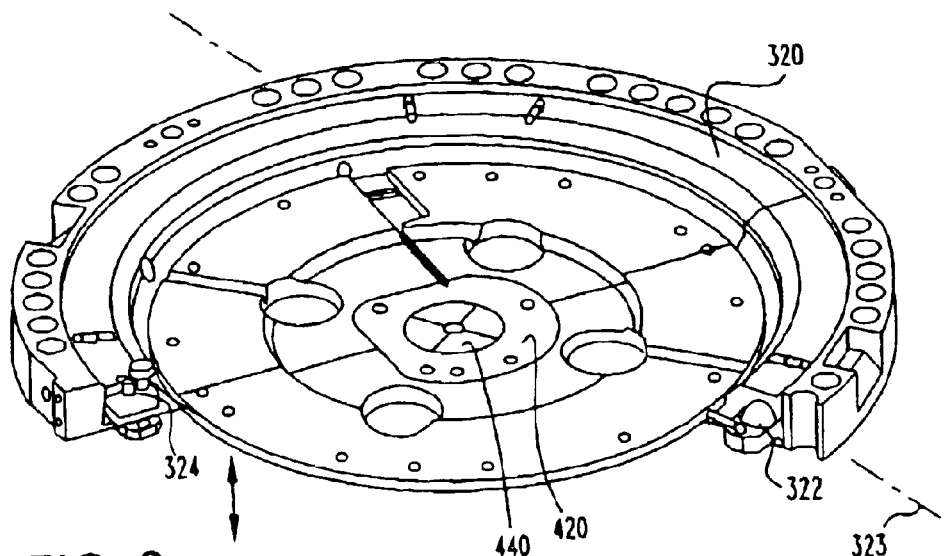
FIG. 3 illustrates the central member of FIG. 1 in perspective.

In the lower portion of the unit, a vertical surface 442 represents one of the two reference laser mirrors that reflect an optical beam 122 in FIG. 5 and thereby link the position of the mechanical apparatus 400 in space to the beam deflection FIG. 3 shows a view of the central plate 320, cut away to show the tilt control mechanism. Plate 320 rests within inner ring 220, on three points. Two tooling balls 322 determine a tilt axis 323 and an adjustment is made by adjuster 324 up or down, thereby changing the angle of plate 320 about the tilt axis. There are a series of extension springs that clamp the plate to the nest ring.

Figure 4:
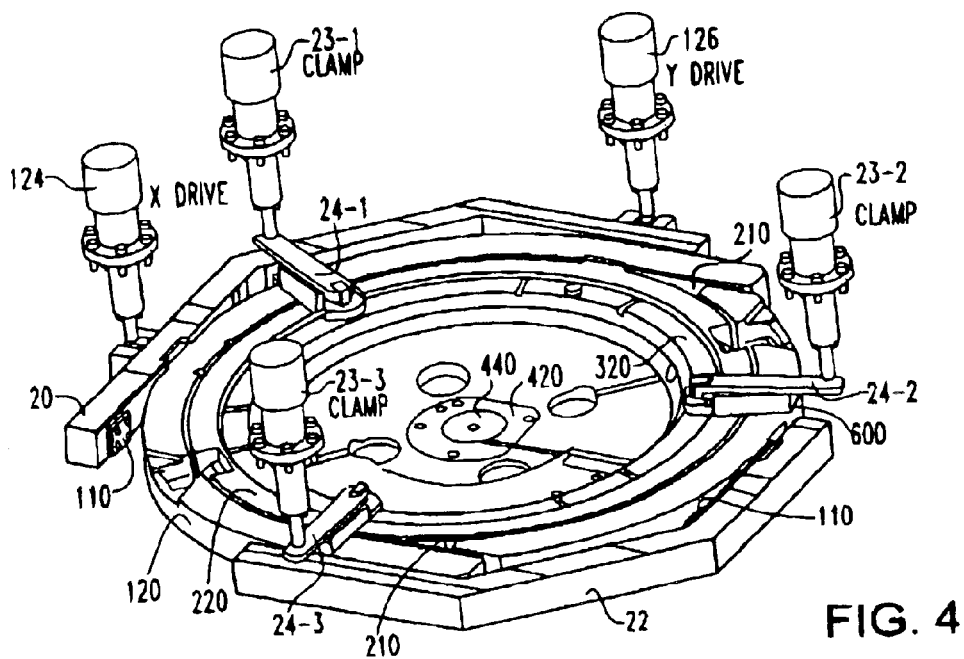
FIG. 4 illustrates an assembly view of a larger portion of an apparatus.

FIG. 4 shows an assembly drawing of the unit. On the left and right of the Figure, members 20 and 22 provide the reference frame for the system. They are attached to a mechanically stable support that varies very little with temperature.

Flexures 110 that support ring 120 are attached to the reference frame. Ring 220, in turn, is attached to ring 120 by flexures 210. Central plate 320 rests on three points as discussed above.

Detector/mirror assembly 420, linking the electron beam and the laser reference system rests in the middle of plate 320.

Figure 6A:
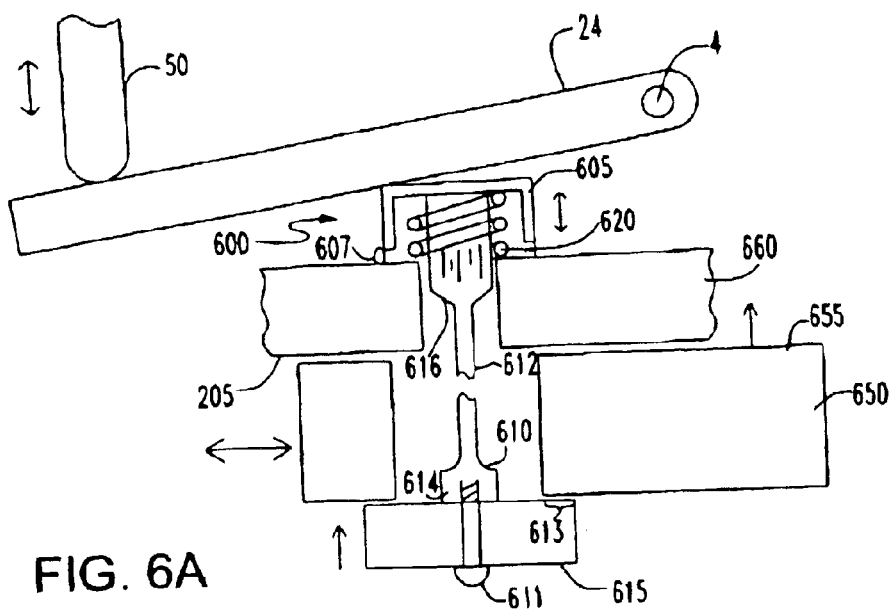
FIGS. 6A and 6B illustrate a detail of a clamping apparatus used in the invention.

After adjustment, rings 120 and 220 are clamped in position. FIG. 6A illustrates a clamping member, or flexure, denoted generally with the numeral 600 and indicating the apparatus comprising cap 605, which receives releasing force to release the clamping action from lever 24, lower base 615, which applies an upward force that performs the clamping, and shaft 610, connecting the upper cap and the lower base and passing through holes in the object and support. This clamp is described in more detail in copending application Docket Number FIS9-2003-0065-US1, incorporated herein by reference.

The clamping force clamps object 650, which is illustratively a fixture in an electron beam system that is aligned with the beam, to support member 660, which is part of a fixed frame that supports the object 650.

In more detail, cap 605 encloses a spring 620 that supplies the clamping force. Illustratively, the clamping force is approximately 100 pounds, which opposes the X-Y driver force from their respective flexures, and vibration, etc. that acts to move the clamped object from its correct position and with the amount of friction between the reference surface 655 of the object and the corresponding reference surface 205 of the support member.

Spring 620 presses against the top surface of support member 660 and the inner surface of cap 605, pushing cap 605 upward. That upward force pulls base 615 up against the lower surface of object 650 through the contact area denoted with bracket 613, which, in turn pushes the reference surfaces together.

Shaft 610 serves as a tension member applying the tension or pulling force to base 615, and has a central portion 612 which is deliberately made thin as described below.

Base 615 is attached to shaft 610 after object 650 is put in place, the attachment method in this illustrative case being a screw 611. Those skilled in the art will be able to devise many other attachment methods.

In operation, actuator 50 presses down on lever 24, which pivots on pin 60. Lever 24 is positioned so that it depresses cap 605 against the restoring force of spring 620, releasing the clamping force holding object 650 in contact with support 660. Object 650 is supported with extension springs attached to the support 660 to negate the force due to weight. It is also desirable to maintain member 650 in its actual plane during adjustment so that we apply contact pressure during clamping to minimize motion along the Z axis.

With the clamping force released, it is then possible to adjust the position of member 650 by conventional adjusting means not shown in this figure to move member 650 left and right in the figure and in and out of the plane of the paper.

It is an advantageous feature of the invention that the extension springs support member 650 during the adjustment process, minimizing frictional force between 650 and 660.

The dimension of the central portion 612 of the shaft is selected in consideration of the amount of deflection resulting from the adjustment process, and the restoring force exerted by the shaft after the adjustment is complete.

Ideally, the shaft would not deflect at all during the adjustment process, so that there would be no concern about the restoring force from the deflected shaft undoing the adjustment. An extremely stiff clamping system in the transverse direction would, however, exert a correspondingly strong restoring force in response to any deflection did occur, so that the restoring force would tend to undo the adjustment.

In a practical system, the stiffness (resulting from the material of shaft 610 and its diameter, particularly the diameter of portion 612) will be selected in consideration of the friction exerted by the clamp such that the deviation from the adjusted position is within the relevant error budget.

Referring again to FIG. 6A, cap 605 is separated from the upper surface of support 660 by a gap denoted by bracket 607, nominally 2 mm. There are two plungers per clamp, and their deflections are quite different (typically by a ratio of 2:1) due to their position along the lever 24. Lever 24 will lower base 615 by (at most) this distance. The lowered distance is also the separation between the upper surface of member 650 and the lower surface of support 660 during the adjustment process.

The material of the central shaft is illustratively nonmagnetic type 300 stainless steel and has a nominal diameter in sections 614 and 616 (chosen for convenience) of 7.5 mm. The central portion of the shaft is reduced by electric discharge machining (Wire EDM), a technique that allows for small cross sections of less than 1 mm, or by another method to a square cross section 1.5 mm on a side over a distance of about 20 mm. These dimensions are not critical and may be adjusted in view of the stiffness of the material and the magnitude of the allowed restoring force. In the example illustrated, the transverse force was selected to be less than a threshold value in order to avoid danger of sliding object 650 after the adjustment. Advantageously, the support springs mentioned above minimize this concern.

Figure 6B:
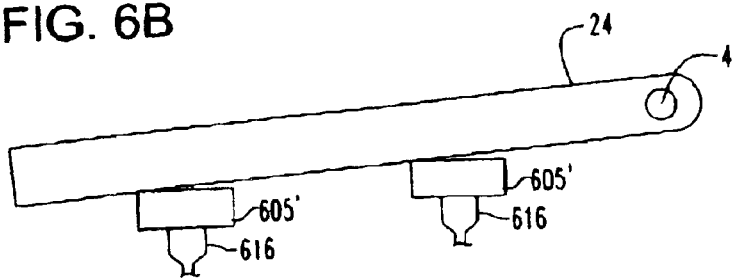

FIG. 6B illustrates an alternative clamping arrangement in which lever 24 deflects two clamps, having caps 605'. The design of this alternative will allow for the difference in deflection between the two clamps. Each clamp may apply a clamping force to the same object or to different objects, as a design choice. In the example illustrated, both inner and outer rings are clamped with similar compression force (controlled by compression springs). The release position (and force required) will vary along the lever.

The invention is not confined to e-beam systems and can be applied in many systems having the problem of making a position adjustment in a vacuum environment.

While the invention has been described in terms of a single preferred embodiment, those skilled in the art will recognize that the invention can be practiced in various versions within the spirit and scope of the following claims.

What is claimed is:

1. An apparatus for relating the position of an electron beam traveling in a vacuum chamber along a beam axis to a mechanical reference, the apparatus comprising:

an outer support member adapted for motion along a first transverse axis and flexibly mounted to a reference frame;

an inner support member adapted for motion along a second transverse axis and flexibly mounted within said outer support member; and a beam-detecting unit in a reference plate supported by said inner support member, said reference plate comprising a central aperture permitting the passage of the electron beam, a scattering unit for scattering electrons from said electron beam, a detector for detecting electrons scattered from said electron beam by said scattering unit and a set of reference mirrors oriented along said first and second transverse axes, whereby signals from said detector representing the position of said beam relative to said detector may be associated with measurements of the position of said reference mirrors.

2. An apparatus according to claim 1, in which said detector for detecting scattered electrons includes means for detecting the location of the beam in a transverse plane perpendicular to the beam axis.

3. An apparatus according to claim 1, further comprising means for detecting the position of the reference plate relative to the beam axis.

4. An apparatus according to claim 1, in which the outer support member is supported in a reference frame by a set of flexures that are compliant along said first transverse axis and stiff along said second transverse axis and along said beam axis.

5. An apparatus according to claim 4, in which the inner support member supporting said reference plate is supported by a set of flexures that are compliant along said second transverse axis and stiff along said first transverse axis and along said beam axis.

6. An apparatus according to claim 5, in which at least the inner support member is clamped during operation and unclamped during adjustment by clamps that are actuated by actuators extending through the chamber wall into the vacuum chamber.

* * * * *